US005514838A

United States Patent [19]
Wen et al.

[11] Patent Number: 5,514,838
[45] Date of Patent: May 7, 1996

[54] CIRCUIT STRUCTURE WITH NON-MIGRATING SILVER CONTACTS

[75] Inventors: Cheng P. Wen, Mission Viejo; Wah S. Wong, Montebello; Min-Wen Chiang, Torrance, all of Calif.

[73] Assignee: Hughes Aircraft Company, Los Angeles, Calif.

[21] Appl. No.: 314,461

[22] Filed: Sep. 27, 1994

[51] Int. Cl.⁶ .................................................. H05K 1/09
[52] U.S. Cl. .......................... 174/257; 174/261; 361/767; 361/771
[58] Field of Search ...................................... 174/256, 257, 174/260, 261, 267; 361/760, 767, 777, 771; 428/901

[56] References Cited

U.S. PATENT DOCUMENTS

| | | |
|---|---|---|
| 3,617,695 | 11/1971 | Meyer et al. . |
| 3,621,442 | 11/1971 | Racht et al. . |
| 3,676,741 | 7/1972 | Forst et al. . |
| 4,544,802 | 10/1985 | Siden . |
| 4,914,814 | 4/1990 | Behun et al. . |

OTHER PUBLICATIONS

"Hybrid Microcircuit Technology Handbook" by James J. Licari and Leonard R. Enlow, Noyes Publications, pp. 102–106 (1988).

Primary Examiner—Laura Thomas
Attorney, Agent, or Firm—M. E. Lachman; M. W. Sales; W. K. Denson-Low

[57] ABSTRACT

An integrated circuit assembly that prevents silver migration by providing conductive rims around oxidizable silver contacts that contact a substrate. Typically the silver contacts are supported by respective metal pads on the substrate with a contact potential existing at each contact-pad junction. In many applications an electrical circuit transmits electrical signals via the contacts to produce potential differences between the contacts and create electrical fields at their surfaces. The conductive rims have a work function that is sufficiently small to reduce the electric fields and contact potentials so as to inhibit the ionization of the oxidized contacts' surfaces and prevent silver migration across the metal pads and the substrate.

15 Claims, 2 Drawing Sheets

CIRCUIT STRUCTURE WITH NON-MIGRATING SILVER CONTACTS

BACKGROUND OF THE INVENTION

1. Field of the Invention

The present invention generally relates to the phenomenon of silver migration on circuit boards or chips, and more specifically to providing conductive rims around the periphery of silver contacts to prevent silver migration.

2. Description of the Related Art

Silver migration is a well known, if not completely understood, problem in electrical circuits that use exposed silver metalization for electrodes, leads or bump connections hereafter referred to as contacts. Silver provides the best electrical and thermal conductivity characteristics for circuit contacts, and is relatively inexpensive, but has the highest propensity to migrate. A silver contact's surface oxidizes when exposed to the atmosphere, creating a thin oxidation layer that exhibits semiconductor properties and has relatively weak bonds between the positively charged silver ions $Ag^+$ and the neighboring silver or silver oxide atoms. Applying bias voltages or transmitting voltage signals via a pair of contacts creates potential differences between the contacts and establishes electric fields at their semiconductor-like oxidized surfaces. These electric fields can ionize the positive contact's (anode) surface and accelerate the $Ag^+$ ions towards the negative contact (cathode) where they recombine with free electrons, causing an electrical short between the contacts. In addition, the migrating silver ions could interfere with other circuitry on the board.

FIG. 1 is a sectional view of a circuit board 10 that is provided with silver contacts 12 and 14 that oxidize when exposed to the atmosphere to form thin layers of silver oxide 16 and 18 on their respective surfaces. Applying a voltage from a voltage source 20 across the contacts produces an electric field at their surfaces. The voltage source 20 can represent the potential difference between otherwise electrically isolated contacts, resulting from ac voltage signals or bias voltages on respective contacts. The surface of the anode's oxidation layer 16 can ionize if the field is strong enough, and the positively charged silver ions will then migrate towards the cathode.

Other metalization materials such as gold and titanium do not have significant migration problems, but are electrically and thermally inferior to silver. Titanium oxide is a very stable compound with strong ionic bonds and remains slightly conductive. Gold does not oxidize when exposed to atmosphere, and hence will not ionize.

Silver migration has been studied for many years without solution. To reduce or avoid the problem Licari and Enlow, "Hybrid Microcircuit Technology Handbook", *Noyes Publications*, pp. 102–106, (1988) suggests reducing the electric fields between critical components by limiting the signal voltages and increasing component spacing, using silver alloys (Pt or Pd) which increase resistance substantially, or hermetically sealing the components to prevent oxidation. These constraints complicate the circuit design, diminish the contacts' electrical properties and increase manufacturing costs. As a result, silver contacts are rarely used. Instead Au, Cu, Pt or Al are generally used for the various metalization requirements in electrical circuits.

SUMMARY OF THE INVENTION

The present invention seeks to prevent silver migration, thereby simplifying circuit design, reducing contact resistance and lowering IC costs.

This is accomplished by forming silver contacts that oxidize when exposed to atmosphere on respective metal pads which are positioned on a substrate. Conductive rims are formed on the pads around the peripheries of the silver contacts. The conductive rims reduce the surface electric fields and contact potentials that would otherwise be established either when a voltage difference is present between the contacts, or as a result of making the contact to a metal with a higher work function. This inhibits the ionization of the oxidized contacts' surfaces and prevents the silver from migrating across the metal pads and the substrate.

For a better understanding of the invention, and to show how the same may be carried into effect, reference will now be made, by way of example, to the accompanying drawings.

Figure 3:
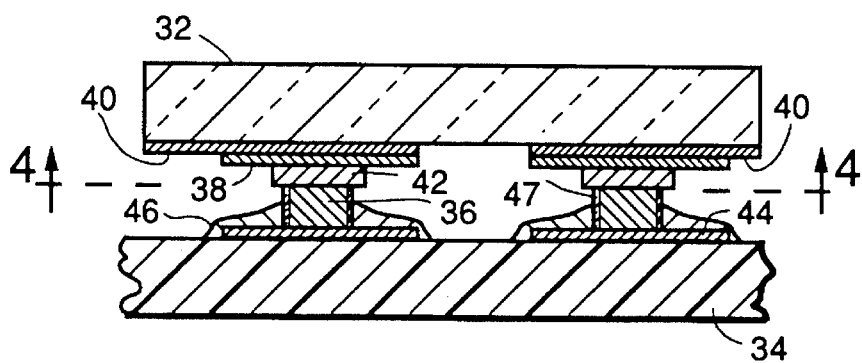
Figure 4:
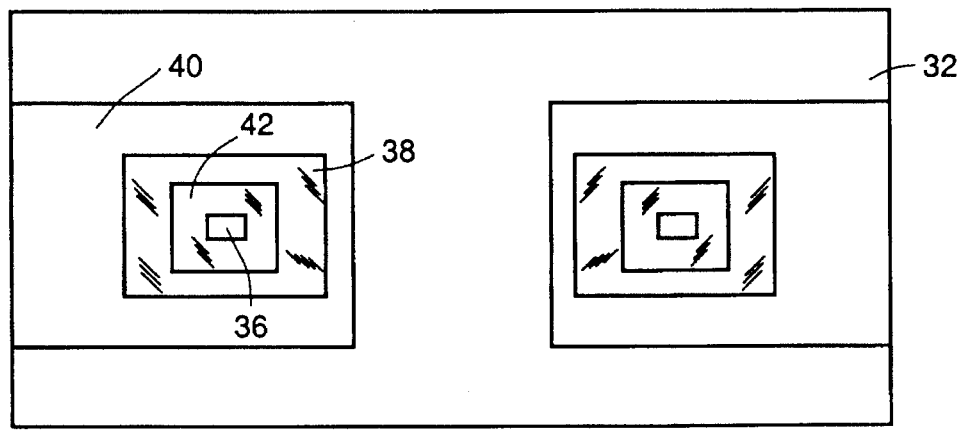
Figure 5:
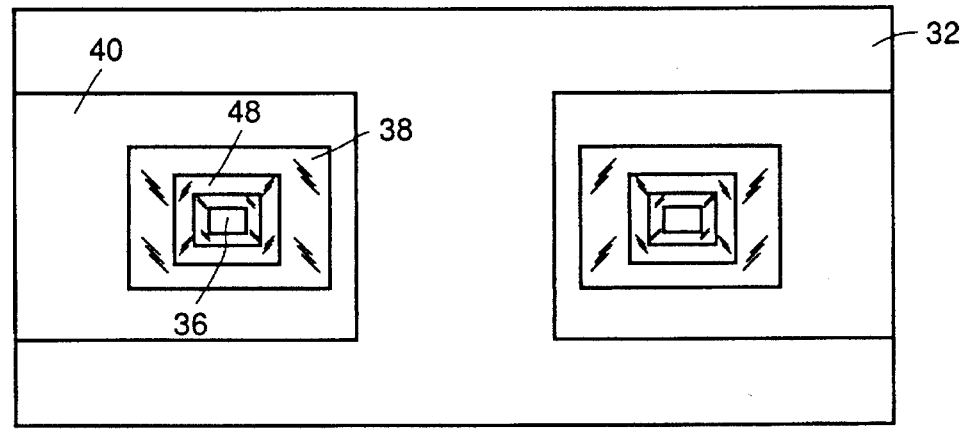

is a sectional view of a preferred embodiment of the invention for a flip-chip microwave monolithic integrated circuit (MMIC);

FIG. 4 is an enlarged plan view along cut-line 4—4 of the preferred embodiment illustrated in FIG. 3;

FIG. 5 is a plan view of an alternative embodiment of the invention; and

Figure 6:
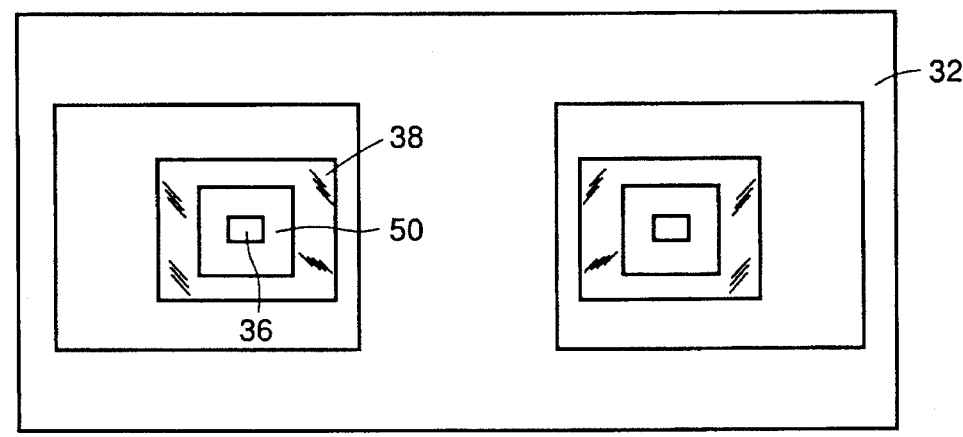

FIG. 6 is a plan view of another embodiment which prevents silver migration resulting from a work function differential between the silver contact and the metal substrate.

DETAILED DESCRIPTION OF THE INVENTION

Figure 1:
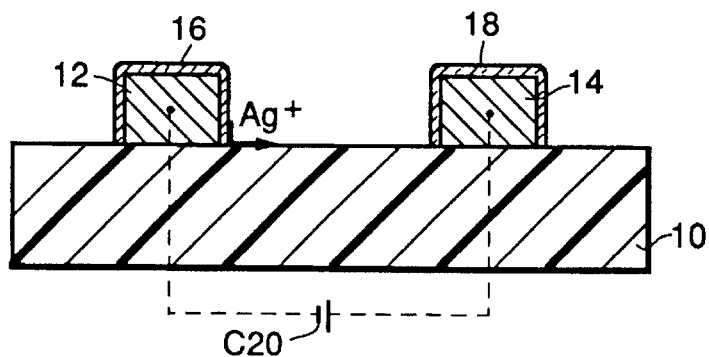
FIG. 1, described above, is a sectional view of silver contacts on a conventional circuit board.
Figure 2:
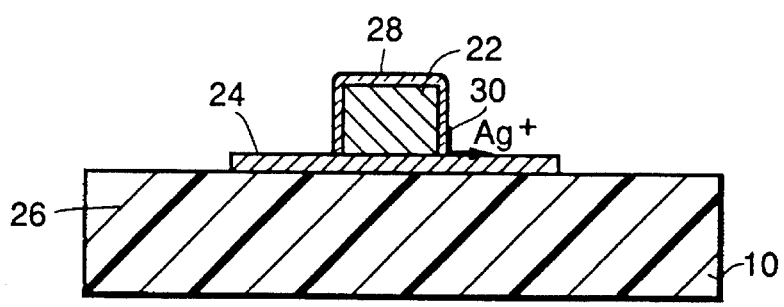
FIG. 2 is a sectional view of a silver contact on a gold ground plane that illustrates the establishment of surface fields and contact potentials in the absence of an applied voltage signal.

In addition to the silver migration problem described above that results from an applied voltage across a pair of silver contacts, the silver migration phenomenon has also been observed by the inventors in the absence of an external electric field. FIG. 2 is a sectional view of a silver contact 22 on a gold ground plane 24 that is disposed on a circuit board 26, with the contact's exposed surface oxidized to a layer of silver oxide 28. The silver contact exhibited substantial migration across the ground plane during a high temperature stabilization bake. This contradicted the conventional wisdom that an external electric field is required to ionize the layer of silver oxide 28 on the contact's surface and accelerate the positively charged silver ions. It is now believed by the inventors that silver migration can be caused by either an externally applied electric field with silver contacts to virtually any kind of solid substrate material, or by a contact potential resulting from the difference in work functions between the silver or silver-oxide contacts and a substrate with a substantially higher work function.

The work function $\Phi$ of a material is the energy required to remove an electron from it, ($\Phi_{AU}$~5.18 eV, $\Phi_{AG}$~4.28 eV).

The contact between the semiconductor-like silver oxide 28 and the gold ground plane produces a Schottky junction around the periphery 30 of the silver oxide, causing the silver oxide layer's surface to ionize at the junction. The large built-in field in the depletion layer produced by the ionization causes the positively charged silver ions $Ag^+$ to move toward the gold/oxide interface. As the silver ions move they recombine with free electrons in the gold and continually oxidize when exposed to the atmosphere, causing the Schottky junction to move with the traveling silver oxide. The migration is sustained until the silver reaches the edge of the ground plane. At this point, an externally applied electric field can cause the silver to migrate across the surface of the circuit board 26 to another contact and cause a short. It appears that silver migration can occur in response to an external and/or a built-in electric field at the interface. The contact metal is not limited to gold, although gold is a common metalization material and has one of the highest work functions. In general, metals with higher work functions than silver may cause silver migration.

FIG. 3 and 4 are respectively sectional and plan views of a preferred embodiment of the invention as applied to a microwave monolithic integrated circuit (MMIC) 32 such as a receiver, transmitter or amplifier, which is flip-chip connected to a circuit board 34. The invention is applicable to any silver metalization formed on a circuit board, flip-chip or other substrate either directly or supported by a metal contact pad.

The flip-chip 32 includes silver bump contacts 36 which typically have a height of 75–100 μm, mounted on metal contacts 38, preferably gold, on the flip-chip. The contacts 38 are electrically connected to integrated circuits (ICs) 40 on the chip. Conductive rims 42, preferably titanium, are formed on respective metal contacts 38 around the peripheries of the silver contacts 36, and are suitably 2000 Å high and 5 μm wide. Metals such as titanium are preferred but other conductive materials such as highly doped semiconductors could be used. The rims' height is preferably as small as possible to avoid degrading the contacts' electrical properties, while still preventing silver migration. The flip-chip 32 and circuit board 34 are reflow soldered to electrically connect the silver contacts 36 to metalization patterns 44, such as contact pads or circuit leads, on the board. In the reflow process the solder 46 surrounds the silver contacts 36 at the board's surface to prevent them from oxidizing, thereby preventing silver migration across the board (as opposed to the rims 42 which prevent silver migration across the chip 32). The solder can climb up the contacts 36 towards the flip-chip 32. As a secondary benefit, the conductive rims 42 act as a solder stop, which prevents the solder from fouling the ICs 18 on the flip-chip.

In normal operation, electrical signals are transmitted between the flip-chip 32 and the circuit board 34 via the silver contacts 36, creating potential differences between the contacts 36 and electric fields at their surfaces. The contacts 36 oxidize when exposed to air to form an oxidation layer 47. The conductive rims 42 prevent silver migration by reducing the electric fields on the contacts' oxidation layer 47 near the rims 42 to levels below that required to ionize the surface of the oxidized contacts. The titanium rim 42 will oxidize, but remains conductive such that the electric field at its surface is approximately zero. The electric fields in the oxidation layer are approximately zero near the rims and increase slowly as one travels along the contacts' oxidized surface away from the rim. The electric field may be sufficiently strong at some distance from the rim to ionize the silver oxide, but migration is unlikely because the silver would have to bridge from the ionization site to the surface of the chip.

By selecting a low work function material such as titanium, chromium or aluminum for the rims 42, the contact potentials between the rims and the contacts' 36 oxidized surfaces are too small to ionize the contacts. The mechanisms that cause and prevent silver migration are not completely understood, partly because it is not currently possible to accurately measure either the work function or dielectric constant of silver-oxide in a depletion layer that is only a few angstroms thick. However, it has been found that silver migration is prevented if the conductive rim's work function is approximately equal to or less than that of silver. Preferably, the low work function material is formed on the contact pad 38 around the silver contact's 42 periphery to prevent silver migration. If the silver contact is mounted directly onto the substrate, the rim is preferably formed on the substrate's surface around the contact's periphery.

In the preferred embodiment illustrated in FIGS. 3 and 4, the titanium rim 42 can be formed by standard thermal evaporation and etching techniques. First, a layer of gold and a layer of titanium are evaporated in turn over the flip-chip 32. The titanium is etched to define the rim 42, and a photoresist is patterned over the flip-chip to expose the area inside the rim. Silver is deposited over the photoresist to form contacts 36 that adhere to the gold layer and the inner surface of the titanium rim. The photoresist is then lifted-off to remove the excess silver. Other fabrication techniques can be used to form the conductive rims without departing from the scope of the invention.

FIG. 5 is a plan view of an alternative embodiment for containing silver migration by replacing conductive rims 42 around the silver contacts (FIGS. 3 and 4) with conductive containment rims 48 that are formed around but do not touch the silver contacts 36 on flip-chip 32. The silver migrates to the rim 48 and stops.

FIG. 6 is a plan view of an embodiment for preventing silver migration in the presence of weak or zero externally applied electric fields when any contact potential resulting from a work function differential between the silver contact and the substrate is sufficient by itself to produce silver migration. If the external fields are not strong enough to ionize the contacts, the conductive rims 42 (FIGS. 3 and 4) can be replaced by dielectric rims 50, such as silicon dioxide or silicon nitride around the contacts. The dielectric rims 50 inhibit ionization by separating the contacts' oxidized surfaces from the Ag/Au junctions and the corresponding contact potentials.

The invention provides a very simple way of preventing silver migration without diminishing the electrical properties of the silver contacts. Eliminating silver migration allows electrically and thermally inferior and more expensive metalization materials, such as gold, to be replaced by pure silver in many applications without having to hermetically seal or redesign the integrated circuitry.

While several illustrative embodiments of the invention have been shown and described, numerous variations and alternate embodiment will occur to those skilled in the art. Such variations and alternate embodiments are contemplated, and can be made without departing from the spirit and scope of the invention as defined in the appended claims.

We claim:

1. A non-migrating silver contact structure, comprising:
   a substrate;
   a plurality of silver contacts that are spaced apart on said substrate and oxidize when exposed to the atmosphere;

a circuit for transmitting signals by means of said contacts wherein said signals produce difference potentials between said contacts and create electric fields at the contacts' surfaces of sufficient strength to ionize the oxidized contacts; and a plurality of conductive rims in contact with said substrate and around the periphery of said respective contacts wherein said conductive rims are formed of a material other than silver, whereby the silver in said contacts is prevented from migrating.

2. The contact of claim 1, wherein said rims are spaced apart from said contacts to prevent migration past said rims.

3. The structure of claim 1, wherein said conductive rims are formed in contact with and around the peripheries of said contacts to reduce said electric fields and inhibit the ionization of said oxidized contacts.

4. The structure of claim 3, wherein the work function of said rims is less than that required to ionize said oxidized contacts.

5. The structure of claim 4, wherein the conductive rims' work function is approximately equal to or less than the work function of silver.

6. The structure of claim 5, wherein the conductive rims are formed from titanium or aluminum.

7. The structure of claim 3, further comprising a plurality of metal pads formed on said substrate wherein said metal pads support respective silver contacts and associated conductive rims, and have a work function greater than that of silver, said conductive rims having a work function less than that required to ionize said contacts.

8. A non-migrating silver contact, comprising:

a substrate;

a metal pad on said substrate having a work function that is greater than that of silver;

a silver contact that oxidizes when exposed to the atmosphere and contacts said metal pad; and a rim on the metal pad and around the periphery of said silver contact to separate the periphery of an oxidized layer formed on said contact surface from said metal pad wherein said conductive rim is formed of a material other than silver, thereby inhibiting ionization of said oxidized contact and preventing silver from said contact from migrating across said metal pad.

9. The structure of claim 8, wherein said rim is formed from a dielectric material.

10. A non-migrating silver contact, comprising:

a substrate;

a silver contact on said substrate that oxidizes when exposed to the atmosphere; and a conductive rim on said substrate and around the periphery of said contact wherein said conductive rim is formed of a material other than silver, to thereby prevent the silver in said contact from migrating.

11. The structure of claim 10, wherein said conductive rim is formed around the periphery of said contact to inhibit the ionization of said oxidized contact.

12. The structure of claim 11, wherein the work function of said rim is less than that required to ionize said oxidized contact.

13. The structure of claim 12, wherein the conductive rim's work function is approximately equal to or less than the work function of silver.

14. The structure of claim 13, wherein the metal rim is formed from titanium or aluminum.

15. The structure of claim 11, further comprising a metal pad on said substrate that supports said silver contact and associated conductive rim, and that has a work function greater than that of silver, said conductive rim having a work function less than that required to ionize said contacts.

* * * * *